US008020748B2

(12) United States Patent
Ivanov et al.

(10) Patent No.: US 8,020,748 B2
(45) Date of Patent: Sep. 20, 2011

(54) SPUTTERING TARGET ASSEMBLY AND METHOD OF MAKING SAME

(75) Inventors: Eugene Y. Ivanov, Grove City, OH (US); Erich Theado, Columbus, OH (US)

(73) Assignee: Toso SMD, Inc., Grove City, OH (US)

( * ) Notice: Subject to any disclaimer, the term of this patent is extended or adjusted under 35 U.S.C. 154(b) by 0 days.

(21) Appl. No.: 12/310,857

(22) PCT Filed: Aug. 8, 2007

(86) PCT No.: PCT/US2007/017598
§ 371 (c)(1),
(2), (4) Date: Mar. 10, 2009

(87) PCT Pub. No.: WO2008/033192
PCT Pub. Date: Mar. 20, 2008

(65) Prior Publication Data
US 2010/0044415 A1    Feb. 25, 2010

Related U.S. Application Data

(60) Provisional application No. 60/844,028, filed on Sep. 12, 2006.

(51) Int. Cl.
*B23K 20/12* (2006.01)
(52) U.S. Cl. ............ 228/112.1; 228/2.1
(58) Field of Classification Search ............. 228/112.1, 228/2.1
See application file for complete search history.

(56) References Cited

U.S. PATENT DOCUMENTS

| 4,349,954 | A | * | 9/1982 | Banks ............................. 29/458 |
| 4,959,241 | A | | 9/1990 | Thomas et al. |
| 5,262,123 | A | | 11/1993 | Thomas et al. |
| 5,342,496 | A | | 8/1994 | Stellrecht |
| 5,460,317 | A | | 10/1995 | Thomas et al. |
| 5,469,617 | A | | 11/1995 | Thomas et al. |
| 5,593,082 | A | | 1/1997 | Ivanov et al. |
| 6,183,686 | B1 | | 2/2001 | Bardus et al. |
| 6,725,522 | B1 | | 4/2004 | Ivanov et al. |
| 6,749,103 | B1 | | 6/2004 | Ivanov et al. |
| 6,758,382 | B1 | | 7/2004 | Carter |
| 6,774,339 | B1 | | 8/2004 | Smathers et al. |
| 7,146,703 | B2 | * | 12/2006 | Ivanov ............................. 29/521 |
| 2004/0194942 | A1 | * | 10/2004 | Okamoto et al. ............. 165/170 |
| 2004/0262157 | A1 | * | 12/2004 | Ford et al. ................ 204/298.12 |

(Continued)

FOREIGN PATENT DOCUMENTS
EP    0337691 A3    4/1990
(Continued)

OTHER PUBLICATIONS

Rhodes, C.G., Mahoney, M.W., Bingel, W.H., Spurling, R.A., Bampton, C.C.: Scripta Mater., 36 (1997), 69.

(Continued)

*Primary Examiner* — Roy King
*Assistant Examiner* — Michael Aboagye
(74) *Attorney, Agent, or Firm* — Wegman, Hessler & Vanderburg

(57) ABSTRACT

A method for producing a sputtering target assembly bonded to a backing plate. The method includes bonding a target (100) to a high strength backing plate (110) and further creating a vacuum seal between the target and the backing plate using friction stir welding processes.

10 Claims, 2 Drawing Sheets

U.S. PATENT DOCUMENTS

| | | | |
|---|---|---|---|
| 2006/0207876 A1* | 9/2006 | Matsumura et al. | 204/298.13 |
| 2006/0283705 A1* | 12/2006 | Tanase et al. | 204/298.12 |
| 2007/0107185 A1* | 5/2007 | Bailey et al. | 29/428 |
| 2008/0135405 A1* | 6/2008 | Hori et al. | 204/298.12 |

FOREIGN PATENT DOCUMENTS

| | | | |
|---|---|---|---|
| EP | 0434430 A1 | | 6/1991 |
| EP | 0460900 A2 | | 12/1991 |
| EP | 0460901 A2 | | 12/1991 |
| EP | 0474455 A2 | | 3/1992 |
| EP | 0474455 A3 | | 5/1992 |
| EP | 0460901 A3 | | 9/1993 |
| EP | 0337691 B1 | | 1/1994 |
| EP | 0460900 A3 | | 5/1994 |
| EP | 0627276 A2 | | 12/1994 |
| EP | 0653265 A2 | | 5/1995 |
| EP | 0653265 A3 | | 7/1995 |
| EP | 0602072 B1 | | 10/1995 |
| EP | 0615480 B1 | | 11/1995 |
| EP | 0627276 A3 | | 12/1995 |
| EP | 0460900 B1 | | 4/1997 |
| EP | 1612292 | | 1/2006 |
| JP | 60251272 | | 12/1985 |
| JP | 2004307906 | * | 11/2004 |
| WO | WO9203247 A1 | | 3/1992 |
| WO | WO9209398 A1 | | 6/1992 |
| WO | WO9219413 A1 | | 11/1992 |
| WO | WO9304813 | | 3/1993 |
| WO | WO9310935 | | 6/1993 |
| WO | WO9524291 A1 | | 9/1995 |
| WO | WO9638256 A1 | | 12/1996 |
| WO | WO9638259 A1 | | 12/1996 |
| WO | WO9952669 A1 | | 10/1999 |
| WO | WO2004065046 | | 8/2004 |
| WO | WO2005094280 | | 10/2005 |
| WO | WO2006093125 | | 9/2006 |
| WO | WO2006093125 | * | 9/2006 |

OTHER PUBLICATIONS

Mahoney, M.W., Rhodes, C.G., Flintoff, J.G., Spurling, R.A., Bampton, W.H.: Metall. Mater. Trans. A, 29A (1998), 1955.
Jones, M.J., Heutier, P., Desrayaud, C., Montheillet, F., Allehaux, D., Driver, J.H.: Scripta Mater., 52 (2005), 693.
Genevois, C., Deschamps, A., Denquin, A., Doisneau-Cottingnies, B.: Acta Mater., 53 (2005), 2447.
Chao, Y.J., Wang, Y., Miller, K.W.: Weld. J., 80 (2001), 196s.
Jata, K.V., Sankaran, K.K., Ruschau, J.J.: Metall. Mater. Trans. A, 31A (2000), 2181.
Stao, S., Kokawa, H.: Metall. Mater. Trans. A, 32A (2001), 3023.
Sato, Y.S. Sato, Kokawa, H., Enomoto, M., Jogan, S.: Metall. Mater. Trans. A, 30A (1999), 2429.
Sato, Y.S., Yamashita, F., Sugiura, Y., Park, S.H.C., Kowawa, H.: Scripta Mater., 50 (2004), 365.
Sato, Y.S., Takauchi, H., Park, S.H.C., Kokawa, H.: Mater. Sci. Eng. A, A405 (2005), 333.
Corrosion reference 37 (2).
The Process, http://ajt-inc.com/theprocess.html, Jun. 9, 2009, 2 pages.
Nova-Tech Engineering LLC, http://www.ntefsw.com/what_is_fsw.htm, Jun. 9, 2009, 1 page.
Emerging Construction Technologies, http://www.new-technologies.org/ECT/Mechanical/fsw.htm, Sep. 7, 2006, 4 pages.
Friction Stir Welding, Wikipedia, http://wikipedia.org/wiki/Friction_stir_welding, Sep. 7, 2006, 7 pages.
Friction Stir Welding, Wikipedia, http://wikipedia.org/wiki/Friction_sitr_welding, Feb. 13, 2008, 7 pages.

* cited by examiner

SPUTTERING TARGET ASSEMBLY AND METHOD OF MAKING SAME

CROSS-REFERENCE TO RELATED APPLICATION

This application claims the priority benefit of U.S. Provisional Patent Application Ser. No. 60/844,028 filed Sep. 12, 2006.

FIELD OF THE INVENTION

The present invention relates to methods for preparing sputter target/backing plate assemblies, and to the target/backing plate assemblies prepared by these methods. More particularly, the invention relates to methods for bonding sputter targets to an associated backing plate using friction stir welding techniques.

BACKGROUND OF THE INVENTION

Cathodic sputtering is widely used for depositing thin layers or films of materials from sputter targets onto desired substrates. Basically, a cathode assembly including the sputter target is placed together with an anode in a chamber filled with inert gas, preferably argon. The desired substrate is positioned in the chamber near the anode with a receiving surface oriented normal to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits to form the thin layer or film on the receiving surface of the substrate.

In order to achieve good thermal and electrical contact between the target and the backing plate, these members are commonly attached to each other by way of soldering, brazing, diffusion bonding, clamping, epoxy cements, or with interlocking annular members. High purity metal and metal alloy sputter targets have also been mechanically bonded to backing plates, for example as disclosed in U.S. Pat. Nos. 6,749,103 B1 and 6,725,522 B1.

The relatively high yield strength coefficient associated with copper and copper alloy or aluminum alloy backing plates, compounded by the use of higher levels of sputtering power required to energize larger sputtering targets, has increased the material stresses imposed on the bonds that join the sputter targets to the backing plates. Under such sputtering conditions, the sputtering target assemblies tend to deflect or separate upon exposure to the changing temperatures that are typically encountered during sputtering. To a certain extent, soft solders have accommodated stresses exerted on the sputter target/backing plate assemblies as the assemblies are heated during the sputtering process and subsequently cooled. When low strength backing plates have been employed in the target/backing plate assemblies, the assemblies tend to deflect significantly during sputtering causing several undesirable effects, such as additional particle generation, decreased uniformity, etc.

Accordingly, there remains a need in the art for a method for bonding sputtering target materials to an alloy backing plate wherein the assembly exhibits significant strength and yield strength. Although sputtering target assemblies may be made using high strength backing plate materials such as Al—SiC composite material (U.S. Pat. No. 6,183,686) or Al alloy 7075, such materials are often impossible to weld at circumferential surfaces due to their chemical composition and poor weldability. In some other cases, there is a need to join an Al alloy target to a Cu alloy backing plate, which is difficult without applying high temperature bonding processes, such as a diffusion bonding process. As is known in the art, such high temperature processes may result in undesirable Al alloy target recrystallization or weak bond strength due to formation of brittle intermetallic compounds between the metals (in this case Cu and Al).

SUMMARY OF THE INVENTION

In accordance with the invention, a target and backing plate are friction stir welded (f.s.w.) together to provide a high strength bond. In one aspect of the invention, the target and backing plate are bonded using low temperature mechanical interlocking techniques such as those set forth in U.S. Pat. Nos. 6,749,103 and 6,725,522. The disclosures of these two patents are incorporated by reference herein. The joint existing around the circumferentially extending target/backing plate interface may then be bonded via friction stir welding.

In another aspect of the invention, the target plate/backing plate may be joined along the plate/plate interfacial surface by friction stir welding. Stated differently, the target and backing plate are joined by f.s.w. along the major joint plate interface that is circumscribed by the perimeter of the assembly.

In both cases, the f.s.w. bonding enables the assembly to withstand the stress and degradation typically encountered during sputtering.

In another aspect, the backing plate comprises alloys with high yield strength such as Al 7000 series, Al 8000 series, and any other alloy based on Al, or Cu and it alloys, such as Cu-1% Cr, Cu-1% Zr, Cu—Be or Cu—Zn, Cu—Ni and similar alloys. Any backing plate material may be used however.

These and other features and advantages of this invention are described in, or are apparent from, the following detailed description, the accompanying drawings and the appended claims.

DETAILED DESCRIPTION OF THE PREFERRED EMBODIMENTS

Figure 1:
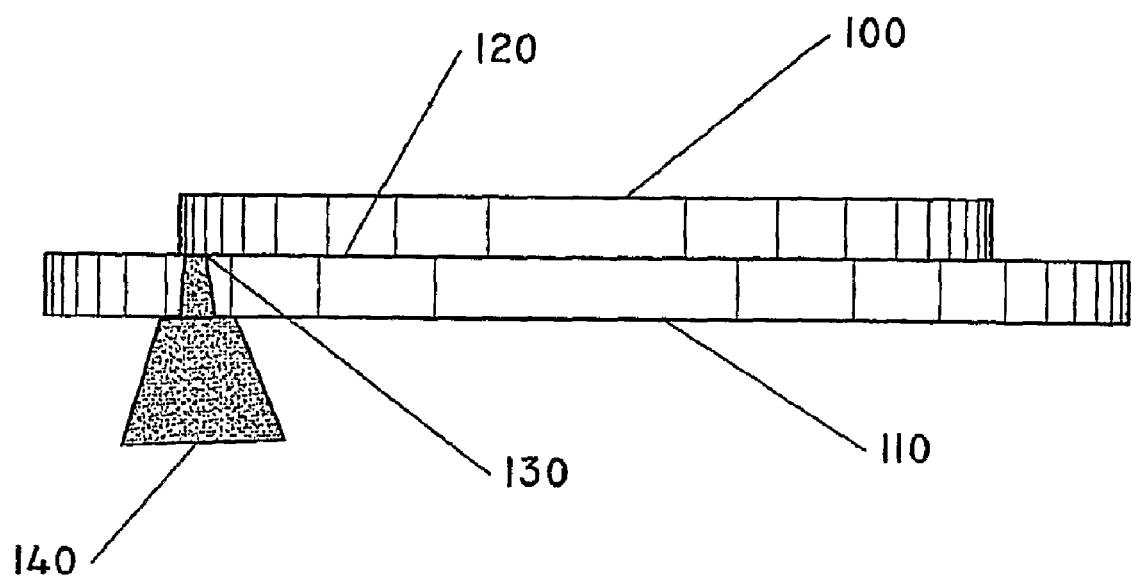
FIG. 1 is a diagrammatic side elevational view of a sputter target/backing plate assembly fabricated according to the present invention.

FIG. 1 is a diagrammatic side view of a preferred sputtering target assembly in accordance with the inventive methods herein disclosed. The sputtering target assembly includes a sputter target 100, superposed atop a heat conductive backing plate 110. As envisioned, the target 100 and backing plate 110 are bonded by any method including the low temperature mechanical interlocking techniques set forth in either U.S. Pat. Nos. 6,749,103 or 6,725,522. As shown, the butt like joint formed along the circumferential interface 120 between the components is bonded 130 by f.s.w. through the backing plate. Cooling water (not shown) may be circulated in contact with the backing plate so as to dissipate heat resulting from the sputtering operation. To prevent corrosion from the cooling water, an anticorrosive layer (not shown) may be disposed on the rear surface of the backing plate.

One problem encountered in producing mechanically joined bonded sputtering target assemblies lies with the difficulty in producing a sputtering target assembly having an hermetic seal at the target diameter. In the past, in order to achieve this hermetic seal, the target and backing plate were welded together by means of usual welding methods, such as electron beam welding, resistance welding or similar. However, some particularly desirable alloys were not suitable for welding methods involve melting of metals. An example of a sputtering target assembly system particularly vulnerable to this problem is an assembly with a series 7000 Al alloy backing plate, which is prone to hot cracking upon exposure to elevated temperatures encountered during welding and, for example, a Cu-40% Zn alloy, which is prone to Zn evaporation during electron beam or other welding techniques under vacuum.

A solder bonded target assembly often combines materials having such undesirable welding properties. Consequently, alternative methods for forming an hermetic seal at the target/backing plate circumference must be used. One of the methods that may be used is HIPing, however, this method requires substantial additional operation and elevated temperature, which may damage the target material microstructure due to annealing process.

Figure 2:
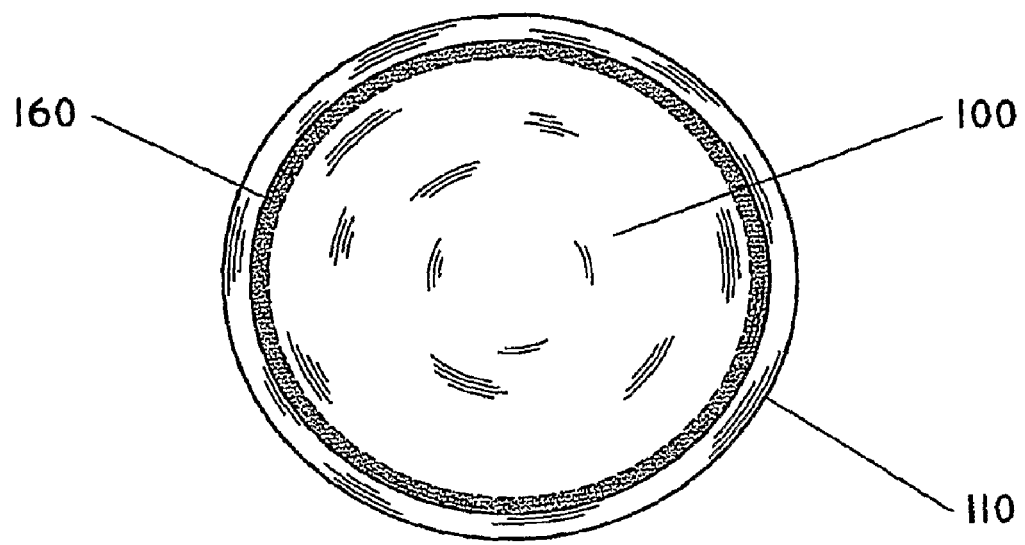
FIG. 2 is a diagrammatic plan view of the target and backing plate assembly of FIG. 1 showing the circumferential joint area that is to be bonded by friction stir welding.

Turning back to FIG. 1 and also now considering FIG. 2, an embodiment of the invention is depicted wherein the circumferential joint 130 between target and backing plate is f.s.w. bonded. As per FIG. 1, the f.s.w. tool 140, as shown, is applied against the assembly from the backing plate side.

As is known in the art, frictional stir welding (f.s.w.) relies upon the high rotational speed of the tool and resulting heat created from contact to crush, mix, and forge a bond between the metal surfaces to be joined. Pin type f.s.w. tools are commercially available. F.s.w. techniques are explained in U.S. Pat. Nos. 5,460,317 and 6,758,382, both incorporated by reference herein.

Figure 3:
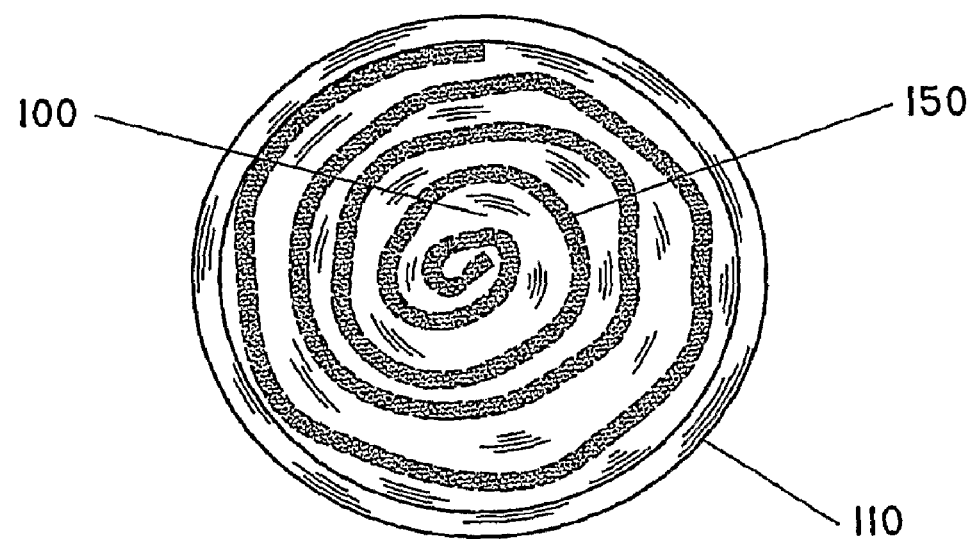
FIG. 3 is a diagrammatic top view showing a spiral f.s.w. joint pattern-formed along the backing plate surface to be bonded.

FIG. 3 is a diagrammatic top view of an assembly wherein the major target/backing plate 110/110 interfacial surfaces are f.s.w. bonded. That is, these major interfacial surfaces are circumscribed by the perimeter of the assembly and are bonded by f.s.w. Here, the f.s.w. pattern 150 can be viewed, in phantom looking through the top plate surface. The spiral pattern 150 shown depicts the weld zone made by a retractable pin type f.s.w. tool 140 or the like impressed upon the assembly from the bottom side of the backing plate 110. The pin may penetrate through the backing plate 110 to a point proximate the target/backing plate 110/110 interface or it may terminate in the backing plate 110 adjacent such interface. (In some cases, it may be possible to penetrate slightly into the target 100). In this way, the target 100 and backing plate 110 are joined by the patterned weld zone. Although, a spiral type pattern 150 is shown in this drawing, other weld patterns such as concentric circles, concentric triangles, squares, dots (ordered or random) etc. can be envisioned. The weld zone area made by the f.s.w. tool 140 must be sufficient when compared to the interfacial area to be joined, to ensure that a strong, durable f.s.w. joint be prepared.

Turning back to the embodiment shown in FIGS. 1 and 2, it is to be remembered that the major target plate/backing plate 100/110 bonding in the area 160 circumscribed by the perimeter of the assembly may be effected by a variety of different techniques. Most preferably, these surfaces are bonding by the low temperature mechanical interlocking techniques previously described wherein one of the interfacial surfaces to be bonded is provided with ridges or other projecting surfaces which penetrate into and bend around the engaging mating surfaces provided on the opposite, mating surface. The structural arrangement and method described in U.S. Pat. No. 6,749,103, FIG. 4, are particularly noteworthy in this regard. Conversely, instead of such low temperature mechanical interlocking techniques, bonding can be achieved via solder bonding, diffusion bonding, explosion bonding, HIPing, hot press, TIG welding, and other conventional techniques.

To illustrate one exemplary embodiment of the invention, described below is an example of producing a bonded Al-0.5% Cu sputtering target assembly comprising an Al 7075 alloy backing plate. Although this example is of an Al 7075 alloy it is apparent that the process may be usefully applied to backing plates of other materials such as alloys of Cu, Ni, other Al alloys, etc. Similarly, various target materials may be employed. In this example, a sputtering target assembly is made using a backing plate composed of Al 7075. In another example, a sputtering target assembly is made using a backing plate composed of Al 6061. Advantageously, a mechanical bonding process is used, including bonding an Al-0.5% Cu target to the backing plate to allow control over the deflection of the assembly.

EXAMPLE 1

A backing plate 110 material is prepared for bonding by machining continuous channels, for example an "M" pattern, on the backing plate 110 surface to be bonded. Once the interfacial surfaces 120 are prepared for bonding, the target 120 and backing plate 110 are assembled by mating the described prepared surfaces 120 and bonding them together by pressing the assembly at room temperature. See U.S. Pat. No. 6,749,103. After mechanical bonding, the assembly is friction stir welded around the target circumference 160 to create a vacuum hermetic seal around the target 100. The f.s.w. can be both done from the target 100 face as well as from the backing plate 110 side.

EXAMPLE 2

A backing plate 100 material is prepared for bonding by grit blasting and chemical cleaning of the surfaces 120 to be bonded. In order to improve wetting of the bonding surface 130 and to improve adhesion of the solder material, both surfaces may be covered by an appropriate wetting or metal layer, preferably nickel, by an appropriate technique, preferably sputtering. Once the interfacial surfaces 120 are prepared for bonding, the target 100 and backing plate 110 are assembled by mating the described prepared surfaces 120 and solder bonding them together by pressing the assembly at a temperature sufficient to melt the solder material, for example 200° C. in the case of indium. After the soldering process is completed, and has joined the major plate like interfacial surfaces 120 the assembly is f.s.w. bonded 130 around the circumference 160 between the target 100 and the backing plate 110 to create an hermetic seal layer between the target 100 and backing plate 110.

EXAMPLE 3

A backing plate 110 material is prepared for f.s.w. bonding by machining the surfaces 120 to be bonded. Once the interfacial surfaces 120 are prepared for bonding, the target 100 and backing plate 110 are assembled by mating the described prepared surfaces and f.s.w. bonding them together along the major plate/plate interface 120 such as in the FIG. 3 embodiment by an f.s.w. pattern covering all of the bonded surfaces, applied for example in a spiral f.s.w. pattern 150, or any other applicable f.s.w. pattern, between the target 100 and backing plate 110 to create the desired f.s.w. bond 130 between target 100 and backing plate 110.

While the methods described herein and the sputter target/backing plate 100/110 assemblies produced in accordance with these methods constitute preferred embodiments of the invention, it is to be understood that the invention is not limited to these precise methods and sputter target/backing plate 100/110 assembly structures, and that changes may be made in either without departing from the scope of the invention, which is defined in the following claims.

What is claimed is:

1. A method of producing a sputter target/backing plate assembly comprising the steps of:
    a) providing a backing plate having a first mating surface and an opposed bottom surface;
    b) providing a sputter target having a second mating surface;
    c) bonding said backing plate and said sputter target together along said first and second mating surfaces to form said assembly; wherein said bonding method is selected from solder bonding, diffusion bonding, HIPing, hot pressing, explosion bonding and TIG welding; and
    d) friction stir weld (fsw) bonding said assembly by penetration of a pin type fsw tool through said bottom surface of said backing plate.

2. A method as recited in claim 1 wherein said backing plate comprises Al or Cu or alloy thereof.

3. A method as recited in claim 2 wherein said Cu alloy comprises Cu/Zn alloy.

4. A method as recited in claim 1 wherein said step (c) comprises mechanically interlocking said target and said backing plate.

5. A method as recited in claim 4 wherein said backing plate comprises Al or Cu or alloy thereof.

6. A method as recited in claim 5 wherein said backing plate comprises Cu/Zn.

7. A method as recited in claim 5 wherein said target comprises Al or alloy thereof.

8. A method as recited in claim 1 wherein said target comprises Al, Cu, Co, Ni, Ta, Ti, or W or alloys thereof.

9. A method as recited in claim 4 wherein said mechanical interlocking comprises forming a groove pattern along said major interfacial surface and compressing said target and backing plate along said interfacial surface at a temperature of less than about 100° C.

10. A method as recited in claim 9 comprising compressing said target and backing plate along said interfacial surface at a temperature of from about room temperature up to about 38° C.

* * * * *

UNITED STATES PATENT AND TRADEMARK OFFICE
CERTIFICATE OF CORRECTION

PATENT NO. : 8,020,748 B2  
APPLICATION NO. : 12/310857  
DATED : September 20, 2011  
INVENTOR(S) : Eugene Y. Ivanov and Erich Theado Page 1 of 1

It is certified that error appears in the above-identified patent and that said Letters Patent is hereby corrected as shown below:

Title page, Item (73) Assignee: Toso SMD, Inc., Grove City, OH (US)  
Please correct the Assignee name to read as: Assignee: Tosoh SMD, Inc., Grove City, OH (US)

Signed and Sealed this  
Nineteenth Day of June, 2012

David J. Kappos  
*Director of the United States Patent and Trademark Office*